United States Patent
Park et al.

(10) Patent No.: US 8,395,157 B2
(45) Date of Patent: Mar. 12, 2013

(54) DOUBLE GATE THIN-FILM TRANSISTOR AND OLED DISPLAY APPARATUS INCLUDING THE SAME

(75) Inventors: Hye-Hyang Park, Yongin (KR); Ki-Ju Im, Yongin (KR); Yong-Sung Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 13/155,329

(22) Filed: Jun. 7, 2011

(65) Prior Publication Data

US 2012/0007084 A1    Jan. 12, 2012

(30) Foreign Application Priority Data

Jul. 7, 2010 (KR) .................. 10-2010-0065461

(51) Int. Cl.
  *H01L 29/04*  (2006.01)
  *H01L 29/10*  (2006.01)
  *H01L 21/00*  (2006.01)
(52) U.S. Cl. .............. 257/59; 257/43; 438/149
(58) Field of Classification Search .......... None
  See application file for complete search history.

(56) References Cited

U.S. PATENT DOCUMENTS

| 2004/0119398 | A1 | 6/2004 | Koo et al. |
| 2005/0140308 | A1 | 6/2005 | Park |
| 2007/0207574 | A1* | 9/2007 | Wang et al. ............ 438/149 |
| 2009/0195289 | A1 | 8/2009 | Subramanian et al. |
| 2010/0025675 | A1* | 2/2010 | Yamazaki et al. .......... 257/43 |
| 2010/0102313 | A1* | 4/2010 | Miyairi et al. ............ 257/43 |

FOREIGN PATENT DOCUMENTS

| JP | 4266656 A | 9/1992 |
| KR | 10-2004-0055223 A | 6/2004 |
| KR | 10-2005-0066630 | 6/2005 |
| KR | 10 2006 01144 A | 11/2006 |
| KR | 10-2008-0078409 A | 8/2008 |

OTHER PUBLICATIONS

Registration Determination Certificate dated Dec. 26, 2011 issued in Korean Priority Application No. 10-2010-0065461, 5 pages.

* cited by examiner

*Primary Examiner* — Julio J Maldonado
*Assistant Examiner* — Harpreet Singh
(74) *Attorney, Agent, or Firm* — Christie, Parker & Hale, LLP

(57) ABSTRACT

A double gate thin-film transistor (TFT), and an organic light-emitting diode (OLED) display apparatus including the double gate TFT, includes a double gate thin-film transistor (TFT) including: a first gate electrode on a substrate; an active layer on the first gate electrode; source and drain electrodes on the active layer; a planarization layer on the substrate and the source and drain electrodes, and having an opening corresponding to the active layer; and a second gate electrode in the opening.

11 Claims, 6 Drawing Sheets

DOUBLE GATE THIN-FILM TRANSISTOR AND OLED DISPLAY APPARATUS INCLUDING THE SAME

CROSS-REFERENCE TO RELATED PATENT APPLICATION

This application claims the benefit of Korean Patent Application No. 10-2010-0065461, filed on Jul. 7, 2010, in the Korean Intellectual Property Office, the disclosure of which is incorporated herein in its entirety by reference.

BACKGROUND

1. Field

The following description relates to a double gate thin-film transistor (TFT), and an organic light-emitting diode (OLED) display apparatus including the double gate TFT.

2. Description of Related Art

Thin-film transistors (TFTs) that are used in flat panel display apparatuses, such as liquid crystal display devices, organic electroluminescent display devices, and inorganic electroluminescent display devices, function as switching devices for controlling an operation of each pixel, and as driving devices for driving pixels.

In general, each TFT has an active layer that has source/drain regions that are heavily doped with impurities, and a channel region formed between the source/drain regions, a gate electrode that is insulated from the active layer and formed at a position corresponding to the channel region, and source/drain electrodes that contact the source/drain regions, respectively.

The active layer is formed of a semiconductor material including amorphous silicon or polysilicon. When the active layer is formed of amorphous silicon, the mobility of carriers decreases such that it is difficult to embody a driving circuit that operates at high speeds. When the active layer is formed of polysilicon, the mobility of the carriers increases but a threshold voltage is not uniform such that it is necessary to arrange a separate compensation circuit.

SUMMARY OF THE INVENTION

Exemplary embodiments of the present invention provide a display apparatus for controlling a threshold voltage of a thin-film transistor (TFT).

According to an aspect of an embodiment of the present invention, there is provided a double gate thin-film transistor (TFT) including: a first gate electrode on a substrate; an active layer on the first gate electrode; source and drain electrodes on the active layer; a planarization layer on the substrate and the source and drain electrodes, and having an opening corresponding to the active layer; and a second gate electrode in the opening.

The active layer may include an oxide semiconductor.

The second gate electrode may be a cathode electrode of an organic light-emitting diode (OLED) display apparatus.

A positive voltage may be configured to be applied to the first gate electrode, and a negative voltage may be configured to be applied to the second gate electrode.

According to an aspect of another embodiment of the present invention, there is provided an organic light-emitting diode (OLED) display apparatus including: a pixel electrode electrically connected to a thin-film transistor (TFT) and located on a planarization layer; a pixel-defining layer (PDL) on the pixel electrode and having a first opening exposing a portion of the planarization layer corresponding to an active layer of the TFT and formed by etching the PDL and the planarization layer, and a second opening exposing a portion of the pixel electrode and formed by etching the PDL; and an opposite electrode located in the first opening and the second opening.

The TFT may include a first gate electrode on a substrate; an active layer on the first gate electrode; and source and drain electrodes on the active layer.

The opposite electrode may be a second gate electrode of the TFT.

According to an aspect of another embodiment of the present invention, there is provided a method of manufacturing an organic light-emitting diode (OLED) display apparatus, the method including: forming a pixel electrode on a planarization layer and electrically connected to a thin-film transistor (TFT); forming a pixel-defining layer (PDL) on the pixel electrode; forming a first opening for exposing a portion of the planarization layer corresponding to an active layer of the TFT by etching the PDL and the planarization layer, and a second opening for exposing a portion of the pixel electrode and formed by etching the PDL; and forming an opposite electrode in the first opening and the second opening.

Before the operation of forming the pixel electrode, the method may further include the operations of forming a first gate electrode on a substrate; forming the active layer on the first gate electrode; forming source and drain electrodes on the active layer; and forming the planarization layer on the source and drain electrodes.

The method may further include the operation of forming a light emitting layer in the second opening before the forming of the opposite electrode.

The opposite electrode may be a second gate electrode corresponding to the first gate electrode.

According to an aspect of another embodiment of the present invention, there is provided a method of manufacturing a double gate thin-film transistor (TFT), the method including: forming a first gate electrode on a substrate; forming an active layer on the first gate electrode; forming source and drain electrodes on the active layer; forming a planarization layer on the source and drain electrodes; forming an opening corresponding to the active layer by etching the planarization layer; and forming a second gate electrode in the opening.

The second gate electrode may be a cathode electrode of an OLED display apparatus.

BRIEF DESCRIPTION OF THE DRAWINGS

The above and other features and advantages of the present invention will become more apparent by describing in detail exemplary embodiments thereof, with reference to the attached drawings, in which.

DETAILED DESCRIPTION

Figure 1:
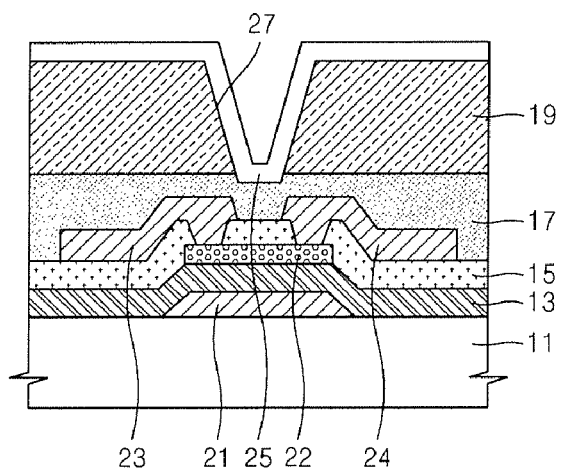
FIG. 1 is a cross-sectional view of a double gate thin-film transistor (TFT) including an oxide semiconductor according to an embodiment of the present invention.

Hereinafter, the present invention will be described in detail by explaining exemplary embodiments of the invention, with reference to the attached drawings. Like reference numerals in the drawings denote like elements. In the following description, well-known functions or constructions are not described in detail, so as not to obscure aspects of the invention with unnecessary detail.

As used herein, the term "and/or" includes any and all combinations of one or more of the associated listed items.

In the drawings, the thicknesses of layers and regions are exaggerated for clarity. Throughout the specification, it will also be understood that when an element such as a layer, film, region, or substrate is referred to as being "on" another element, it can be directly on the other element, or one or more intervening elements may also be present.

Recently, research has been conducted to use an oxide semiconductor as the active layer. An oxide TFT using an oxide semiconductor as the active layer can be manufactured in a low temperature procedure, can have a large area due to its amorphous phase, and has good electrical characteristics like polysilicon.

FIG. 1 is a cross-sectional view of a thin-film transistor (TFT) including an oxide semiconductor according to an embodiment of the present invention.

Referring to FIG. 1, the TFT is a double gate NMOS transistor including a bottom gate electrode 21, an active layer 22, source/drain electrodes 23/24 formed at sides of the active layer 22, and a top gate electrode 25.

In more detail, the bottom gate electrode 21 is formed on a substrate 11, and a gate-insulating layer 13 is formed to cover the substrate 11 and the bottom gate electrode 21. The active layer 22 formed of an oxide semiconductor is formed on the gate-insulating layer 13. An interlayer insulating layer 15 is formed to cover the active layer 22. The source/drain electrodes 23/24 on the interlayer insulating layer 15 are connected to the active layer 22 via contact holes, and a planarization layer 17 is formed to cover the source/drain electrodes 23/24. A pixel-defining layer (PDL) 19 is formed on the planarization layer 17 so as to prevent or reduce color-mixing between pixels. By patterning the PDL 19 and the planarization layer 17, a hole 27 is formed corresponding to the active layer 22, and then the top gate electrode 25 is formed in the hole 27.

The active layer 22 may be formed of a transparent oxide semiconductor, and forms a channel between the source/drain electrodes 23/24.

In an oxide TFT in which an oxide semiconductor is used as an active layer, when an NMOS has a stable characteristic, a threshold voltage (hereinafter, referred to as Vth) has a negative value or a value near a negative value, such that malfunction may occur in circuit operation. Also, when a compensation circuit is used, if Vth has a negative value, compensation may not be appropriately performed.

Thus, the Vth should be adjusted or shifted from a negative value to a positive value, and for such a shift, either a procedure can be changed, or a width and/or length (W/L) of a channel can be adjusted. However, these methods may not assure reliability.

In an embodiment of the present invention, a bias is applied to the top gate electrode 25, so that Vth is shifted to a positive value. An electrode layer to which a fixed voltage is applied may be used as the top gate electrode 25 of the TFT, wherein the electrode layer may be from among the existing electrode layers of a display apparatus. Thus, it is not necessary to separately form a top gate electrode 25, or to arrange an external power source or additional wiring for applying the bias to the top gate electrode 25. In this manner, an aperture ratio of the display apparatus is increased, and a factor that causes process error is reduced.

Hereinafter, a description will be followed with reference to an example in which a cathode of an organic light-emitting diode (OLED) display apparatus is used as the top gate electrode 25.

Figure 2:
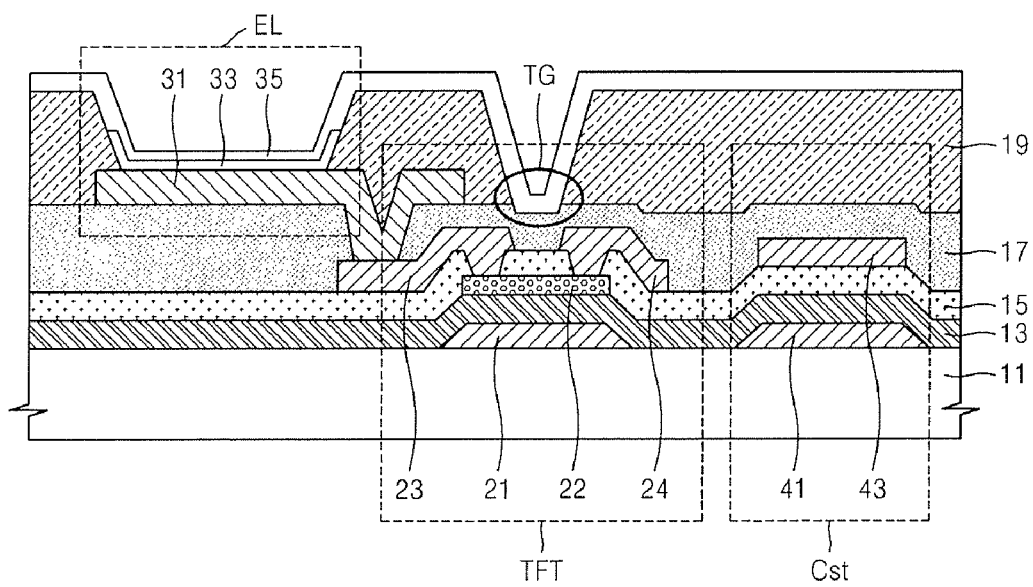
FIG. 2 is a cross-sectional view of an organic light-emitting diode (OLED) display apparatus including a double gate TFT according to an embodiment of the present invention.

FIG. 2 is a cross-sectional view of an OLED display apparatus including a double gate TFT according to an embodiment of the present invention.

Referring to FIG. 2, the OLED display apparatus is formed of a driving unit including the double gate TFT having an oxide semiconductor, a light-emitting unit including organic electro luminescence (organic EL), and a storage unit including a capacitor Cst.

The double gate TFT is a double gate NMOS transistor including a bottom gate electrode 21, an active layer 22, and source/drain electrodes 23/24 formed at sides of the active layer 22. Also, in the double gate TFT, an opposite electrode 35 of the organic EL is used as a top gate electrode.

In more detail, the bottom gate electrode 21 is formed above a substrate 11, and a gate-insulating layer 13 is formed to cover the substrate 11 and the bottom gate electrode 21. The active layer 22 formed of an oxide semiconductor is formed on the gate-insulating layer 13. An interlayer insulating layer 15 is formed to cover the active layer 22. The source/drain electrodes 23/24 on the interlayer insulating layer 15 are connected to the active layer 22 via contact holes, and a planarization layer 17 is formed to cover the source/drain electrodes 23/24. The active layer 22 may be formed of a transparent oxide semiconductor, and forms a channel between the source/drain electrodes 23/24. An opening is formed in a region of the planarization layer 17 corresponding to the active layer 22, and the opposite electrode 35 of the light-emitting unit is formed in the aperture.

The organic EL is formed of a pixel electrode 31 connected to one of the source/drain electrodes 23/24 of the double gate TFT, the opposite electrode 35, and an intermediate layer 33 including a light-emitting layer interposed therebetween. The pixel electrode 31 functions as an anode, and the opposite electrode 35 functions as a cathode, while also functioning as a top gate electrode TG of the double gate TFT.

The capacitor Cst is formed of a first electrode 41 and a second electrode 43, where the gate-insulating layer 13 and the interlayer insulating layer 15 are interposed between the first and second electrodes 41 and 43.

In the current embodiment, a cathode voltage (that is, a negative voltage) is applied to the opposite electrode 35 of the light-emitting unit which is the top gate electrode TG of the double gate TFT, and a positive voltage is applied to the bottom gate electrode 21, so that the active layer 22 is supported in forming an n channel, shifting a Vth to a positive value.

FIGS. 3 through 7 are cross-sectional views of a procedure of manufacturing an OLED display apparatus including a double gate TFT according to an embodiment of the present invention.

Figure 3:
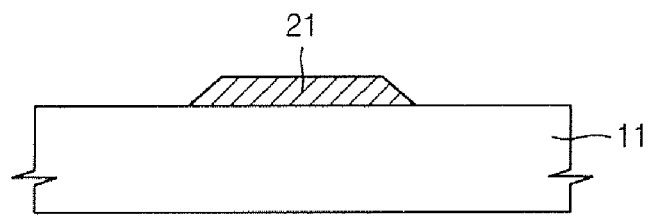
FIGS. 3 through 7 are cross-sectional views of a procedure of manufacturing an OLED display apparatus including a double gate TFT according to an embodiment of the present invention.

Referring to FIG. 3, a bottom gate electrode 21 of the double gate TFT is formed on a substrate 11. Before forming the bottom gate electrode 21 of the double gate TFT, a buffer layer (not shown) may be formed on the substrate 11. The buffer layer may function to prevent or reduce impurities of the substrate 11 from penetrating into layers arranged above the substrate 11. The buffer layer may include silicon oxide ($SiO_2$) and/or silicon nitride (SiNx).

The substrate 11 may be formed using a transparent glass material including $SiO_2$. Also, the substrate 11 may include a plastic material. The substrate 11 may include a metal foil and/or a flexible substrate.

The bottom gate electrode 21 may be formed using a metal selected from the group consisting of Au, Ag, Cu, Ni, Pt, Pd, Al, Mo, W, and Ti or may be formed using a metal alloy such as an Al—Nd alloy, a Mo—W alloy, and the like but is not limited thereto. In fact, the bottom gate electrode 21 may be formed by using various materials in consideration of properties or characteristics such as adhesion with an adjacent layer, planarization, electrical resistance, formability, or the like.

Figure 4:
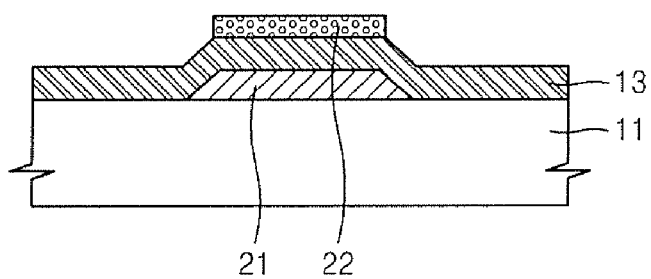

Referring to FIG. 4, a gate-insulating layer 13 and an active layer 22 are sequentially formed on the bottom gate electrode 21.

The gate-insulating layer 13 is formed on the substrate 11 and on the bottom gate electrode 21. The gate-insulating layer 13 may be formed using an insulating material including silicon oxide or silicon nitride, or may be formed using an insulating organic material.

Afterward, the active layer 22 is formed on the gate-insulating layer 13. The active layer 22 may include a channel region that overlaps with the bottom gate electrode 21, and may include an oxide semiconductor. The active layer 22 may include an oxide semiconductor including at least one element selected from the group consisting of In, Ga, Zn, Sn, Sb, Ge, Hf, and As. For example, the oxide semiconductor may include at least one of ZnO, $SnO_2$, $In_2O_3$, $Zn_2SnO_4$, $Ga_2O_3$, and/or $HfO_2$. Also, the active layer 22 may be formed using a transparent oxide semiconductor. For example, the transparent oxide semiconductor may include Zinc Oxide, Tin Oxide, Ga—In—Zn Oxide, In—Zn Oxide, and/or In—Sn Oxide, but is not limited thereto. The active layer 22 may be formed by using a sputtering method, which is physical deposition. The active layer 22 may be formed by controlling a quantity of oxygen according to a resistance value corresponding to the TFT.

Figure 5:
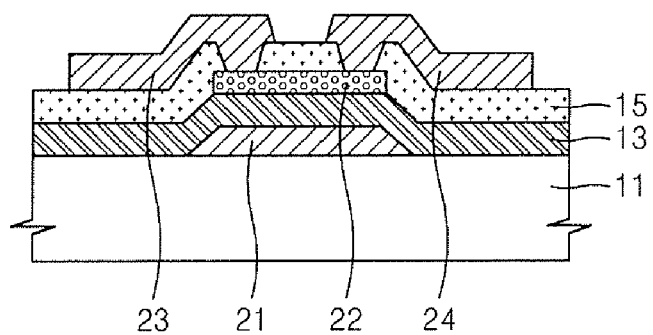

Referring to FIG. 5, an interlayer insulating layer 15, and source/drain electrodes 23/24 are sequentially formed on the active layer 22.

First, the interlayer insulating layer 15 is formed on the substrate 11 and on the active layer 22. The interlayer insulating layer 15 may be formed using an insulating material including silicon oxide or silicon nitride, or may be formed using an insulating organic material.

Contact holes are formed by selectively removing the interlayer insulating layer 15, and the source/drain electrodes 23/24 having a single layer or multi-layers are formed on the interlayer insulating layer 15, so as to cover the contact holes. The source/drain electrodes 23/24 respectively contact both sides of the active layer 22 via the contact holes. The source/drain electrodes 23/24 may be formed using a conductive material, for example, metal including Cr, Pt, Ru, Au, Ag, Mo, Al, W, Cu, and/or AlNd, or metal or conductive oxide including ITO, GIZO, GZO, AZO, IZO(InZnO), or AZO(AlZnO).

Figure 6:
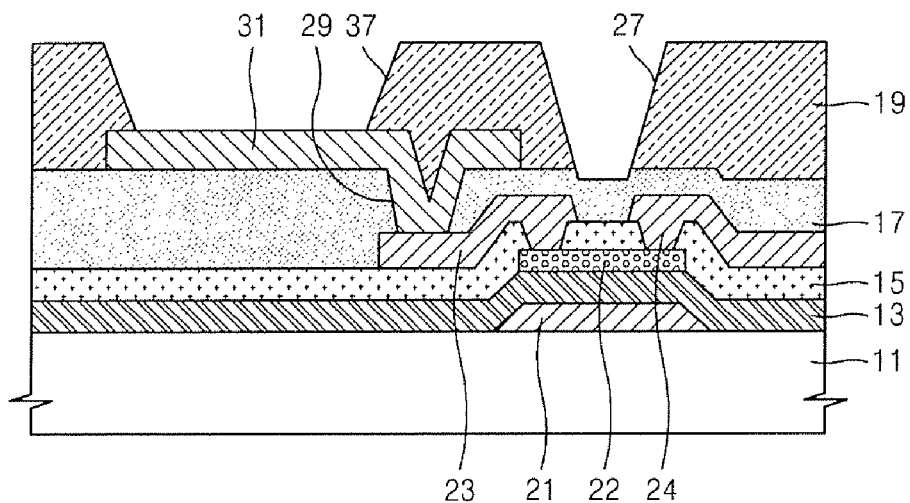

Referring to FIG. 6, a planarization layer 17 is formed on the substrate 11 and on the source/drain electrodes 23/24, and thus the planarization layer 17 functions to protect and planarize the double gate TFT below or under it. The planarization layer 17 may be formed by using one of various methods, and may be formed using an organic material including benzocyclobutene (BCB) or acryl, or an inorganic material including SiNx. Also, the planarization layer 17 may be formed as a single layer, a double-layer, or a multi-layer.

A pixel electrode 31 is formed on the planarization layer 17, and is electrically connected to one of the source/drain electrodes 23/24 via a contact hole 29.

The pixel electrode 31 may be formed using one of various conductive materials. In a bottom emission type OLED display apparatus, in which an image is realized toward the substrate 11, the pixel electrode 31 may be a transparent electrode and may be formed using a material including ITO, IZO, ZnO, and/or $In_2O_3$, which has a high work function. In a top emission type OLED display apparatus in which an image is realized away from the substrate 11, the pixel electrode 31 may be a reflective electrode, and may include a material selected from the group consisting of Ag, Mg, Al, Pt, Pd, Au, Ni, Nd, Ir, Cr, Li, Ca. and combinations thereof. A material including ITO, IZO, ZnO, or $In_2O_3$ having a high work function may further be formed thereon.

A pixel defining layer (PDL) 19 is deposited on the substrate 11 including the pixel electrode 31. The PDL 19 defines a unit pixel part. The PDL 19 may be formed using an organic insulating material including at least one material selected from the group consisting of polyimide, polyamide, acrylic resin, BCB, and phenol resin, according to a spin coating method. The PDL 19 may also be formed using an inorganic insulating material selected from the group consisting of $SiO_2$, SiNx, $Al_2O_3$, CuOx, $Tb_4O_7$, $Y_2O_3$, $Nb_2O_5$, and $Pr_2O_3$. Also, the PDL 19 may have a multi-layered structure in which an organic insulating material and an inorganic insulating material are alternately formed.

A first opening 27 is formed by etching portions of the PDL 19 and the planarization layer 17 which correspond to the active layer 22. A second opening 37 is also etched and formed to expose a portion of the pixel electrode 31.

Figure 7:
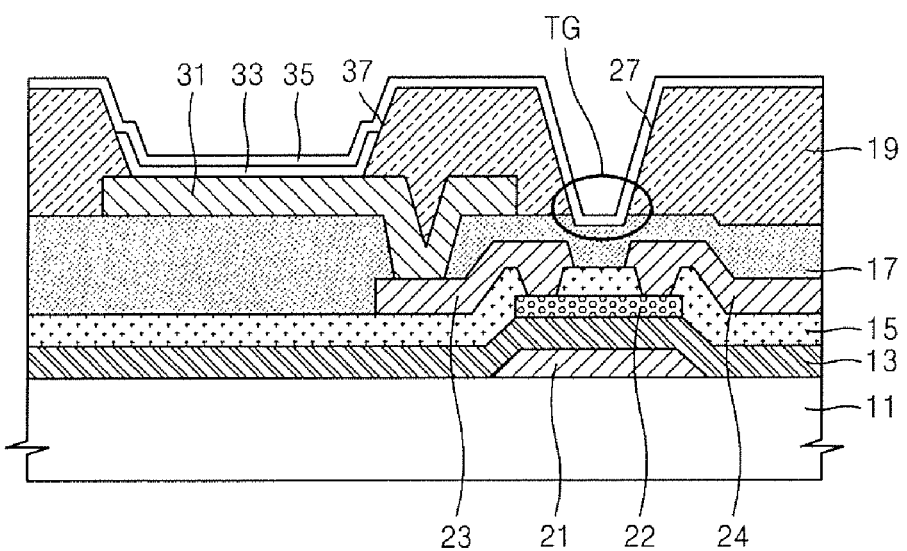

Referring to FIG. 7, an intermediate layer 33 including a light-emitting layer is formed in the second opening 37, and an opposite electrode 35 is formed on the substrate 11 so as to cover at least the intermediate layer 33.

The intermediate layer 33 may have a single or multi-layered structure in which one or more layers from among an emissive layer (EML), a hole transport layer (HTL), a hole injection layer (HIL), an electron transport layer (ETL), and/or an electron injection layer (EIL) are formed.

The intermediate layer 33 may be formed using a low-molecular or high-molecular organic material.

In the case where the intermediate layer 33 is formed using a low-molecular organic material, the intermediate layer 33 has a structure in which the HTL and the HIL are stacked toward the pixel electrode 31, and the ETL and the EIL are stacked closer to the opposite electrode 35, with respect to the EML. In addition to these layers, various layers may be stacked accordingly. Here, an organic material that may be used includes copper phthalocyanine (CuPc), N,N'-Di(naphthalene-1-yl)-N,N'-diphenyl-benzidine (NPB), tris-8-hydroxyquinoline aluminum) ($Alq_3$), or the like.

In a case where the intermediate layer 33 is formed using a high-molecular organic material, the intermediate layer 33 may have a structure in which only the HTL is stacked closer to the pixel electrode 31, with respect to the EML. The HTL may be formed on the pixel electrode 31 by using poly-(2,4)-ethylene-dihydroxy thiophene (PEDOT) or polyaniline (PANI), according to an inkjet printing method or a spin coating method. Here, a high-molecular organic material including a Poly-Phenylenevinylene (PPV) based material, a polyfluorene-based material, or the like, may be used, and a color pattern may be formed by using a general method including an inkjet printing method, a spin coating method, or a thermal transfer method using laser.

The opposite electrode 35 may be deposited on an entire surface of the substrate 11, and may cover the first and second openings 27 and 37. In the OLED display apparatus according to an embodiment of the present invention, the pixel electrode 31 is used as an anode, and the opposite electrode 35 is used as a cathode. The opposite electrode 35 covers the first opening 27 and functions as a top gate electrode TG facing the bottom gate electrode 21, and covers the second opening 37 and functions as the cathode facing the pixel electrode 31.

In a bottom emission type OLED display apparatus in which an image is realized toward the substrate 11, the opposite electrode 35 is a reflective electrode. Such a reflective electrode may be formed using metal having a low work function and selected from the group consisting of Ag, Mg, Al, Pt, Pd, Au, Ni, Nd, Ir, Cr, Li, Ca, LiF/Ca, LiF/Al, and combinations thereof. In a top emission type OLED display apparatus in which an image is realized toward the opposite electrode 35, the opposite electrode 35 may be a transparent electrode and may be formed whereby a metal which has a low work function and selected from the group consisting of Ag, Mg, Al, Pt, Pd, Au, Ni, Nd, Ir, Cr, Li, Ca, and combinations thereof, is deposited, and then an auxiliary electrode layer or a bus electrode line is formed thereon by using a transparent conductive material including ITO, IZO, ZnO and/or $In_2O_3$.

Although not illustrated in FIG. 7, a sealing member (not shown) and a moisture absorbent (not shown) may further be arranged on the opposite electrode 35, so as to protect the EML from external moisture or oxygen.

Figure 8:
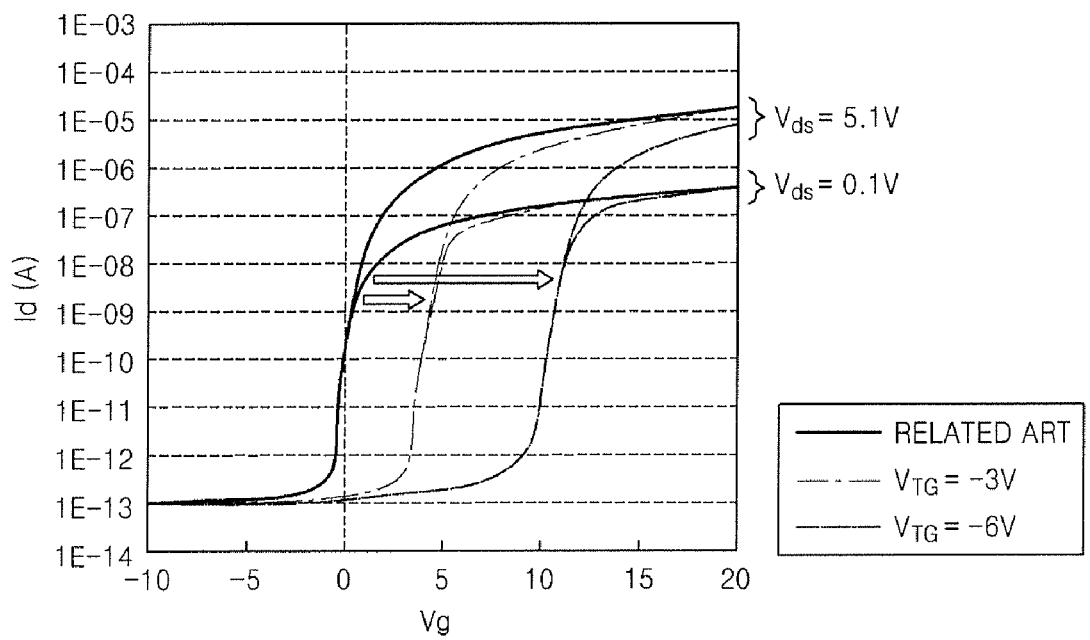
FIGS. 8 and 9 are graphs illustrating electrical characteristics of the double gate TFT according to an embodiment of the present invention.
Figure 9:
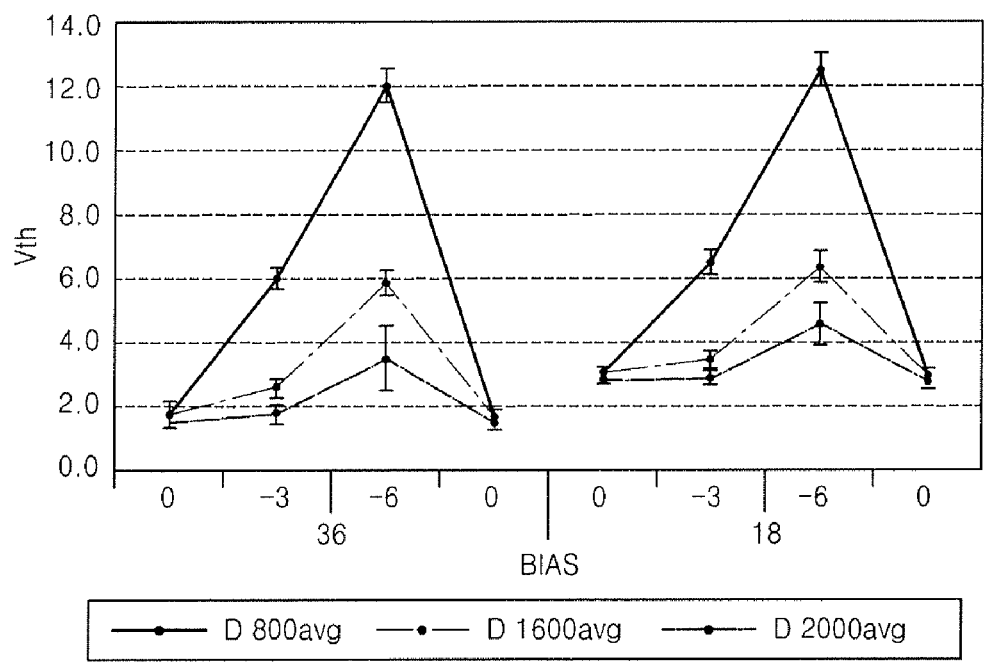

FIGS. 8 and 9 are graphs for illustrating electrical characteristics of a double gate TFT according to an embodiment of the present invention.

FIG. 8 illustrates a voltage (gate voltage Vg) characteristic between bottom gate-source, and a current (drain current Id) characteristic between drain-source, for a case in which a voltage is not applied to a top gate electrode of a double gate TFT (that is, when the double gate TFT is operated in substantially a same manner as a conventional single gate TFT), and for cases in which −3V and −6V are respectively applied to the top gate electrode of a double gate TFT according to embodiments of the present invention. In the graph of FIG. 8, the horizontal axis represents the gate voltage, and the vertical axis represents the drain current. Also, the graph of FIG. 8 illustrates a voltage (drain voltage Vds) between drain-source being 5.1V and 0.1V, respectively.

Referring to FIG. 8, in a conventional single gate TFT, Vth is closer to a negative voltage, but in the double gate TFT according to embodiments of the present invention, Vth shifts rightward, and thus shifts to a more positive voltage.

For example, when either −3V or −6V is applied to the top gate electrode, Vg is about 6V and 12V, respectively.

FIG. 9 illustrates a change in Vth, with respect to a bias voltage that is applied to a top gate electrode of a double gate TFT according to an embodiment of the present invention. The left diagram in the graph of FIG. 9 corresponds to a case in which a length of an active layer is 36 μm, and the right diagram in the graph of FIG. 9 corresponds to a case in which the length of the active layer is 18 μm.

Referring to FIG. 9, when bias voltages of 0V, −3V, and −6V are applied to the top gate electrode, respectively, Vth shifts to a positive voltage. Here, Vth is further increased as the length of the active layer is shortened.

Also, when a distance D between the active layer and the top gate electrode is varied, e.g., when the distance D is set as 800 Å, 1600 Å, and 2000 Å, respectively, the change in Vth increases as the distance D decreases. However, regardless of variations in the distance D, Vth will shift to a more positive voltage as the bias voltage is decreased.

Figure 10:
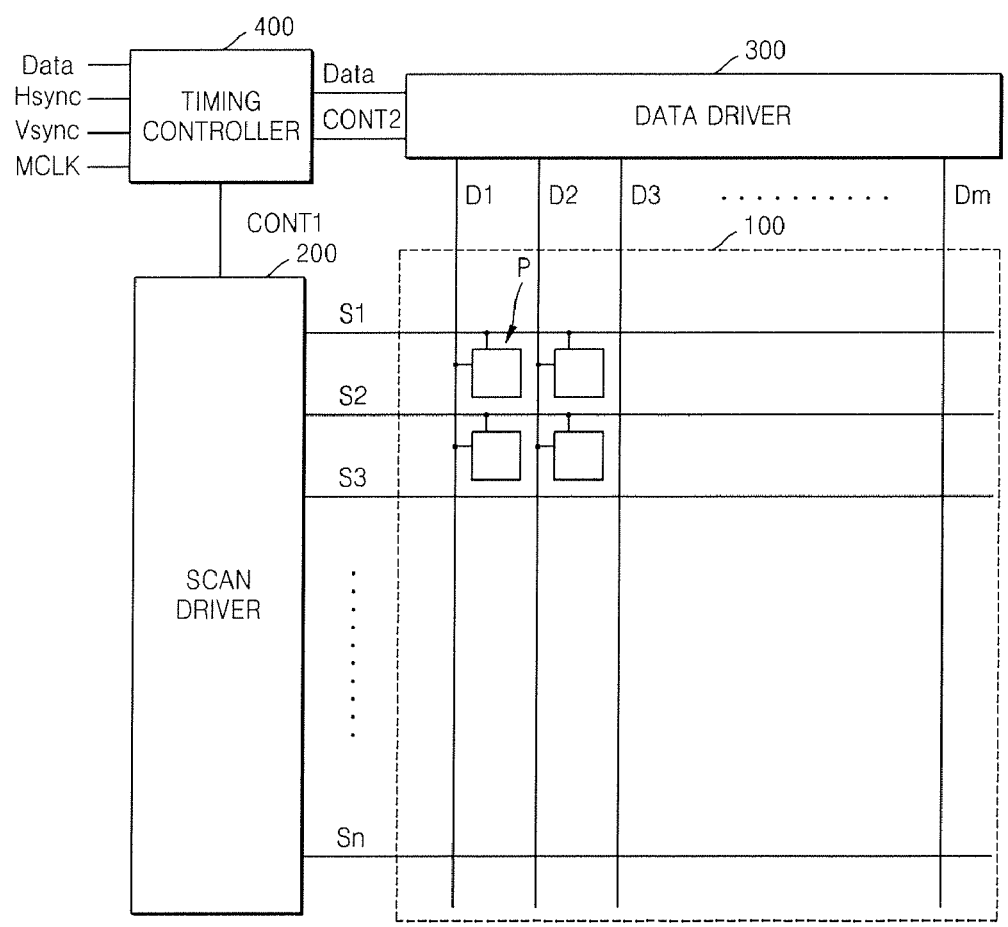
FIG. 10 is a circuit diagram of a portion of an OLED display apparatus according to an embodiment of the present invention.
Figure 11:
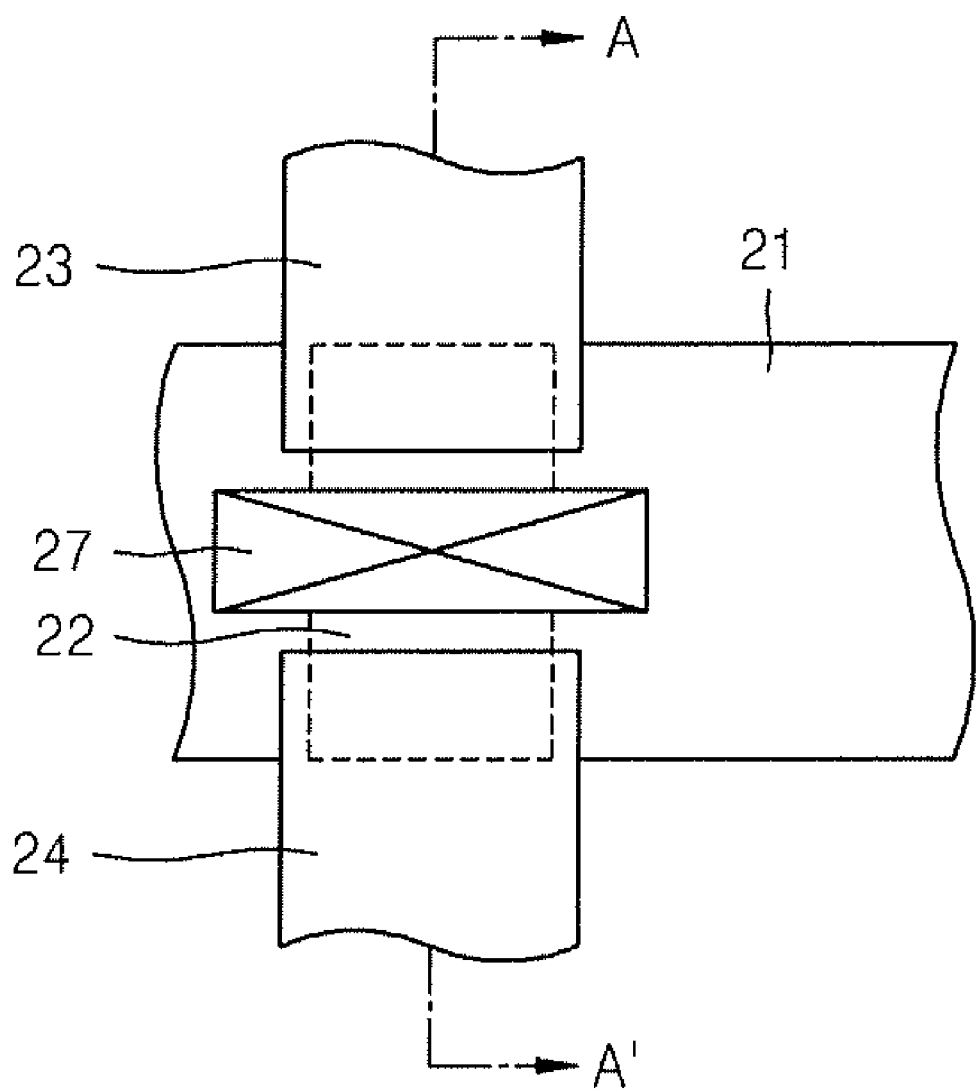
FIG. 11 is a top view of a TFT included in a pixel of the OLED display apparatus of FIG. 10.

FIG. 10 is a circuit diagram of a portion of an OLED display apparatus according to an embodiment of the present invention. FIG. 11 is a plan view of a TFT included in a pixel of the OLED display apparatus of FIG. 10.

Referring to FIG. 10, the OLED display apparatus includes an organic light-emitting panel 100, a scan driver 200, a data driver 300, and a timing controller 400.

The organic light-emitting panel 100 includes a plurality of scan lines S1-Sn, a plurality of data lines D1-Dm, and a plurality of pixels P. The plurality of scan lines S1-Sn are separated from each other by a substantially uniform distance, are arrayed in rows (e.g., extend in a row direction), and provide scan signals, respectively. The plurality of data lines D1-Dm are separated from each other by a substantially uniform distance, are arrayed in columns (e.g., extend in a column direction), and provide data signals, respectively. The plurality of scan lines S1-Sn and the plurality of data lines D1-Dm are arrayed in a matrix, and pixels are formed at respective crossing regions.

The scan driver 200 is connected to the plurality of scan lines S1-Sn, and applies a scan signal to each of the plurality of scan lines S1-Sn, wherein the scan signal has a gate-on voltage and a gate-off voltage. The scan driver 200 may apply the scan signal in such a manner that a plurality of scan signals, which are applied to the plurality of scan lines S1-Sn, respectively, may sequentially have a gate-on voltage. In a case where the scan signal is a gate-on voltage, a switching transistor connected to a corresponding scan line is turned on.

The data driver 300 is connected to the plurality of data lines D1-Dm of the organic light-emitting panel 100, and applies a data signal indicating a gray level to each of the plurality of data lines D1-Dm. The data driver 300 converts input image data Data, which is input from the timing controller 400 corresponding to different gray levels, to a data signal in the form of a voltage or current.

The timing controller 400 may receive input image data Data, and an input control signal for controlling display of the input image data Data from an external graphic controller (not shown). The input control signal may include a horizontal synchronization signal Hsync, a vertical synchronization signal Vsync, and a main clock MCLK. The timing controller 400 provides the input image data Data to the data driver 300, and generates and provides a scan control signal CONT1 and a data control signal CONT2 to the scan driver 200 and the data driver 300, respectively. The scan control signal CONT1 may include a scan start signal SSP for indicating scan start, and a plurality of clock signals SCLK, and the data control signal CONT2 may include a clock signal, and a horizontal synchronization start signal STH for indicating a provision of the input image data Data to a pixel on a particular row.

The pixels P each includes a switching device for controlling an operation of each pixel, and a TFT and a light-emitting unit which are driving devices for driving each pixel.

The TFT is a double gate TFT including an oxide semiconductor, and may be formed as an NMOS transistor in which a cathode of the light-emitting unit is used as a top gate electrode. The TFT may be an embodiment of the present invention, for example, as described above.

Referring to FIG. 11, the TFT includes an active layer 22 above a bottom gate electrode 21, source/drain electrodes 23/24 overlapping with sides of the active layer 22, and a first opening 27 that corresponds to a center portion of the active layer 22 to form the top gate electrode.

A gate-insulating layer is interposed between the bottom gate electrode 21 and the active layer 22, the source/drain electrodes 23/24 contact the active layer 22, with an interlayer insulating layer interposed therebetween, and a planarization layer and a PDL are further formed above the source/drain electrodes 23/24. By etching the planarization layer and the PDL, the first opening 27 is formed at a position corresponding to the center portion of the active layer 22.

In a case where the TFT is used in an OLED display apparatus, an electrode layer functioning as a cathode may be formed in the first opening 27, and may also function as a top gate electrode. A cross-section taken along a line A-A' of FIG. 11 is illustrated in the TFT region of FIG. 6.

In the above embodiments, the double gate TFT is utilized in an OLED display apparatus. However, according to other embodiments of the present invention, the double gate TFT may be used in various other types of display apparatuses, for example, a display apparatus including an electrode layer to which a fixed voltage is applied.

According to embodiments of the present invention, an existing electrode layer to which a constant voltage is applied may be used as the top gate electrode of the double gate TFT, and thus manufacturing processes and a modular structure may be simplified, and an aperture ratio may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A double gate thin-film transistor (TFT) comprising:
a first gate electrode on a substrate;
an active layer on the first gate electrode, with a gate-insulating layer between the first gate electrode and the active layer;
source and drain electrodes on the active layer, with an interlayer insulating layer between the active layer and at least a portion of the source and drain electrodes;
a planarization layer on the substrate and the source and drain electrodes, and having an opening corresponding to the active layer; and
a second gate electrode in the opening.

2. The double gate TFT of claim 1, wherein the active layer comprises an oxide semiconductor.

3. The double gate TFT of claim 1, wherein a positive voltage is configured to be applied to the first gate electrode, and a negative voltage is configured to be applied to the second gate electrode.

4. The double gate TFT of claim 1, wherein the second gate electrode is a cathode electrode of an organic light-emitting diode (OLED) display apparatus.

5. An organic light-emitting diode (OLED) display apparatus comprising:
a pixel electrode electrically connected to a thin-film transistor (TFT) and located on a planarization layer;
a pixel-defining layer (PDL) on the pixel electrode and having a first opening exposing a portion of the planarization layer corresponding to an active layer of the TFT and formed by etching the PDL and the planarization layer, and a second opening exposing a portion of the pixel electrode and formed by etching the PDL; and
an opposite electrode located in the first opening and the second opening.

6. The OLED display apparatus of claim 5, wherein the TFT comprises:
a first gate electrode on a substrate;
an active layer on the first gate electrode; and
source and drain electrodes on the active layer.

7. The OLED display apparatus of claim 6, further comprising:
a gate-insulating layer between the first gate electrode and the active layer; and
an interlayer insulating layer between the active layer and at least a portion of the source and drain electrodes.

8. The OLED display apparatus of claim 6, wherein a positive voltage is configured to be applied to the first gate electrode, and a negative voltage is configured to be applied to the opposite electrode.

9. The OLED display apparatus of claim 5, wherein one of the source and drain electrodes is connected to the pixel electrode.

10. The OLED display apparatus of claim 5, wherein the opposite electrode is a second gate electrode of the TFT.

11. The OLED display apparatus of claim 5, wherein the active layer comprises an oxide semiconductor.

* * * * *

UNITED STATES PATENT AND TRADEMARK OFFICE
CERTIFICATE OF CORRECTION

PATENT NO. : 8,395,157 B2  
APPLICATION NO. : 13/155329  
DATED : March 12, 2013  
INVENTOR(S) : Hye-Hyang Park et al.

Page 1 of 1

It is certified that error appears in the above-identified patent and that said Letters Patent is hereby corrected as shown below:

On the Title Page item (56), line 4,

References Cited,      Delete "KR 10 2006 01144 A"

Foreign Patent Documents      Insert -- KR 10 2006 0114459 A --

Signed and Sealed this  
Eighth Day of July, 2014

Michelle K. Lee  
*Deputy Director of the United States Patent and Trademark Office*